(12) United States Patent
Friedman et al.

(10) Patent No.: US 9,203,159 B2
(45) Date of Patent: Dec. 1, 2015

(54) PHASED-ARRAY TRANSCEIVER

(75) Inventors: Daniel J. Friedman, Sleepy Hollow, NY (US); Xiaoxiong Gu, White Plains, NY (US); Duixian Liu, Scarsdale, NY (US); Arun S. Natarajan, White Plains, NY (US); Scott K. Reynolds, Amawalk, NY (US); Alberto Valdes Garcia, Hartsdale, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 759 days.

(21) Appl. No.: 13/371,924

(22) Filed: Feb. 13, 2012

(65) Prior Publication Data

US 2013/0069831 A1    Mar. 21, 2013

Related U.S. Application Data

(60) Provisional application No. 61/535,759, filed on Sep. 16, 2011.

(51) Int. Cl.
*H01Q 1/24* (2006.01)
*H01Q 21/06* (2006.01)

(52) U.S. Cl.
CPC ......... *H01Q 21/065* (2013.01); *Y10T 29/49016* (2015.01)

(58) Field of Classification Search
CPC ....................................................... H01Q 1/24
USPC ...................................................... 343/702
See application file for complete search history.

(56) References Cited

U.S. PATENT DOCUMENTS

| 2006/0076658 | A1 | 4/2006 | Wu | |
|---|---|---|---|---|
| 2009/0153158 | A1* | 6/2009 | Dunn et al. | 324/750 |
| 2010/0190464 | A1 | 7/2010 | Chen et al. | |
| 2010/0193935 | A1 | 8/2010 | Lachner et al. | |

FOREIGN PATENT DOCUMENTS

| CN | 1848430 A | 10/2006 |
|---|---|---|
| JP | 2007174443 | 7/2007 |
| JP | 2010219588 | 9/2010 |

OTHER PUBLICATIONS

Haupt, R. "Thinned Arrays Using Genetic Algorithms" IEEE Transactions on Antennas and Propagation, vol. 42, No. 7. Jul. 1994. pp. 993-999.

(Continued)

*Primary Examiner* — Dameon E Levi
*Assistant Examiner* — Andrea Lindgren Baltzell
(74) *Attorney, Agent, or Firm* — Tutunjian & Bitetto, P.C.; Anne V. Dougherty (57) ABSTRACT

Systems, methods, devices and apparatuses directed to transceiver devices are disclosed. In accordance with one method, a first set of antenna positions in a first section of a set of sections of a circuit layout for the circuit package is selected. The method further includes selecting another set of antenna positions in another section of the circuit layout such that an arrangement of selected antenna positions of the other set is different from an arrangement of selected antenna positions of a previously selected set of antenna positions. The selecting another set of positions in another section is iterated until selections have been made for a total number of antennas. The selecting the other set is performed such that consecutive unselected positions in the other section do not exceed a predetermined number of positions. In addition, antenna elements are formed at the selected positions to fabricate the circuit package.

16 Claims, 10 Drawing Sheets

(56) References Cited

OTHER PUBLICATIONS

Kam, D., et al. "Organic Packages With Embedded Phased-Array Antennas for 60-Ghz Wireless Chipsets" IEEE Transactions on Components, Packaging and Manufacturing Technology, vol. 1, No. 11. Nov. 2011. pp. 1806-1814.

International Search Report and Written Opinion for International Application No. PCT/IB2012/053142. Nov. 15, 2012. (10 Pages).

* cited by examiner

PHASED-ARRAY TRANSCEIVER

RELATED APPLICATION INFORMATION

This application claims priority to provisional application Ser. No. 61/535,759, filed on Sep. 16, 2011, incorporated herein by reference.

GOVERNMENT RIGHTS

This invention was made with Government support under Contract No.: HR0011-11-C-0136 awarded by the Defense Advanced Research Projects Agency (DARPA). The Government has certain rights in this invention.

BACKGROUND

1. Technical Field

The present invention relates to transceivers, and more particularly to phased-array transceiver systems, devices, apparatuses and methods of their packaging and fabrication.

2. Description of the Related Art

Antenna elements of phased-array transceiver system packages are typically arranged in a uniform pattern. In particular, the uniform pattern assists in assuring that interference-inducing side lobes of radiation patterns are minimized. At millimeter-wave frequencies, phased-antenna arrays can be formed in integrated circuit packages, and larger, scaled arrays can be formed by placing multiple packages adjacent to one another on a circuit board. An existing package for a transceiver device operating at 60 GHz employs 16 antennas that are distributed over a 28×28 mm$^2$ ball-grid array (BGA).

SUMMARY

One embodiment is directed to a method for fabricating an integrated circuit package containing antenna elements. In accordance with the method, a first set of antenna positions in a first section of a set of sections of a circuit layout for the circuit package is selected. The method further includes selecting another set of antenna positions in another section of the circuit layout such that an arrangement of selected antenna positions of the other set is different from an arrangement of selected antenna positions of a previously selected set of antenna positions. The selecting another set of positions in another section is iterated until selections have been made for a total number of antennas. Further, the selecting the other set is performed such that consecutive unselected positions in the other section do not exceed a predetermined number of positions. In addition, antenna elements are formed at the selected positions to fabricate the circuit package.

Another embodiment is directed to a system for forming a circuit package. The system includes a storage medium and a computation module. The storage medium is configured to store a circuit layout for the circuit package. In addition, the computation module is configured to select a first set of antenna positions in a first section of a set of sections of the circuit layout, select another set of antenna positions in another section of the circuit layout such that an arrangement of selected antenna positions of the other set is different from an arrangement of selected antenna positions of a previously selected set of antenna positions, and iterate the selection of another set of positions until selections have been made for a total number of antennas. The selection of the other set is performed such that consecutive unselected positions in any portion of the circuit layout do not exceed a predetermined number of positions.

An alternative embodiment is directed to a computer readable storage medium including a computer readable program for forming a circuit package. The computer readable program when executed on a computer causes the computer to perform a plurality of steps. The steps include selecting a first set of a number (N) of antenna positions in a first section of a number (M) of sections of a circuit layout for the circuit package. Here, each of the sections of the circuit layout is composed of M selectable antenna positions. The steps further include selecting another set of N antenna positions in another section of the M sections of the circuit layout such that an arrangement of selected antenna positions of the other set is different from an arrangement of selected antenna positions of a previously selected set of antenna positions. The steps also include iterating the selecting of another set of positions until selections have been made for a total number of antennas. The selection of the other set is performed such that consecutive unselected positions in any portion of the circuit layout do not exceed $$\frac{M^2 - N^2}{M} + 1$$

positions.

Another embodiment is directed to a circuit device. The circuit device includes integrated circuitry and a set of antenna elements. The integrated circuitry is configured to process communication signals. In addition, the set of antenna elements is coupled to the circuitry and is arranged on a circuit layout composed of a plurality of sections of positions. At least one section of the circuit layout is composed of an arrangement of antennas that is different from an arrangement of antennas of at least other section of the circuit layout. Further, consecutive unused positions in any of the sections do not exceed a predetermined number of positions.

An alternative embodiment is directed to a transceiver apparatus that includes a plurality of integrated circuit packages. The circuit packages are assembled such that each given package of the packages is oriented differently from any packages that are adjacent to the given package. In addition, each of the packages includes a set of antenna elements and integrated circuitry. The set of antenna elements is arranged on a circuit board layout composed of a plurality of sections of positions. At least one section of the circuit layout is composed of an arrangement of antennas that is different from an arrangement of antennas of at least other section of the circuit layout. Here, consecutive unused positions in any of the sections do not exceed a predetermined number of positions. Further, the integrated circuitry is coupled to the set of antenna elements and is configured to process at least one of: a) signals for transmission through antenna elements in the set of antenna elements or b) signals received through antenna elements in the set of antenna elements.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The use of uniform, fully-filled, antenna array arrangements in integrated circuit packages reduces the incidence of side lobes of radiation patterns. However, because the integrated circuit packages contain the integrated circuit and wiring in addition to the antennas, it is technically impractical to fill the entire surface of the package with antennas at an approximately λ/2 spacing between the antenna elements, where λ is the inverse of the operating frequency of the associated transceiver; there are generally not enough corresponding antenna signals provided by the integrated circuits. Thus, not all of the available spaces for antenna elements on the circuit package can be filled. While arranging the antenna elements with a λ/2 can avoid undesirable side lobes in the radiation pattern when a single package is employed, scaling the circuit with multiple packages to form a large scale array would result in wide spaces between antenna elements of adjacent packages. Here, large sidelobes of the radiation pattern of the large scale array would be observed due to the large, systematic spaces between the antenna elements of adjacent packages. Further, this problem is exacerbated when the operating frequency is relatively high, such as, for example, on the order of 90 GHz, since the wavelength is smaller and for a constant package size and constant number of feeds, this results in a lower fill factor.

In accordance with exemplary embodiments described herein, transceiver packages can be constructed in a way that minimizes the size of interference-inducing side lobes of antenna array radiation patterns for the transceiver, while at the same time permitting simplified routing of connections between antenna elements and underlying integrated circuitry. In particular, the antenna elements of a circuit package can be arranged in a distinctly non-uniform manner to minimize the collective side lobes of radiation patterns of large scale arrays. For example, sections of the circuit layout can include different arrangements of antenna elements. In addition, the antenna elements can be incorporated into the package such that a pre-determined spacing threshold between antenna is not exceeded. For example, assuming that an array of M×M of antenna locations are available in the package and there are N×N antenna elements that are to be incorporated into the package, the selections of antenna element locations can be made such that there are no more than $$\frac{M^2 - N^2}{M} + 1$$

consecutive empty or dummy locations in the antenna array. In this way, for example, large empty or dummy regions of the antenna array, which contribute to side lobes of the array radiation pattern, can be avoided. Furthermore, use of this threshold also assists in scaling the packages, as it prevents the occurrence of large void regions between packages that are tiled to form a scaled circuit. In addition, the selections of antenna locations can be configured such that differences between selected arrangements of antenna in different areas of the package can be moderated to facilitate the routing of connections between integrated circuit elements and the antenna.

As will be appreciated by one skilled in the art, aspects of the present invention may be embodied as a system, method, apparatus, device or computer program product. Accordingly, aspects of the present invention may take the form of an entirely hardware embodiment, an entirely software embodiment (including firmware, resident software, micro-code, etc.) or an embodiment combining software and hardware aspects that may generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus, systems, devices and computer program products according to embodiments of the invention. It will be understood that blocks of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 17:
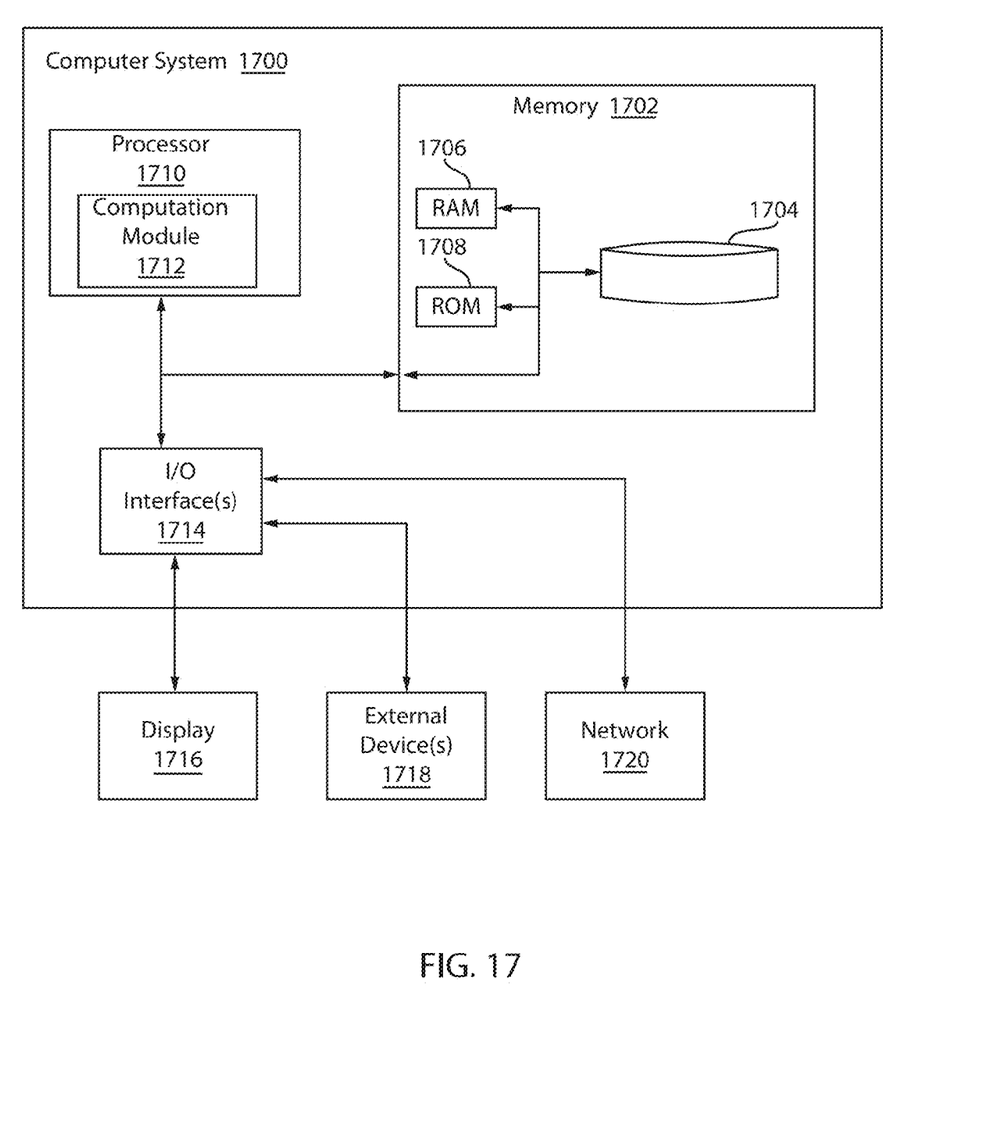
FIG. 17 is a high-level block diagram of a computer system that can implement features of exemplary embodiments.

With reference to FIG. 17, an exemplary computer system 1700 that can implement aspects of the present principles is illustratively depicted. The computer system 1700 can include a processor 1710 and a memory 1702. The memory 1702 can include random-access memory (RAM) 1706 and read-only memory (ROM) 1708. In addition, the memory 1702 can further include a computer readable storage medium 1704. The computer readable storage medium 1704 can store a program of instructions that can be implemented by the processor 1710. In particular, the processor 1710 implement a computation module 1712 that performs the instructions stored on the memory 1702, which can include features of methods described herein. As described in more detail below, the computation module 1712 can embody and implement several aspects of the present principles in the design and/or fabrication of a circuit package and/or a scaled integrated circuit. The computer system 1700 can further include input/output (I/O) interface(s) 1714, which can comprise, for example, physical ports or WiFi devices, that can couple to external devices for communication of data between the computer system 1700 and the devices. Such devices can include a display device 1716, network devices 1720, such as routers for connections to external networks, including local area networks (LANs) and the internet, and other external devices 1718, such as a mouse and a keyboard.

The flowchart and block diagrams in the Figures illustrate the architecture, functionality, and operation of possible implementations of systems, methods and computer program products according to various embodiments of the present invention. In this regard, blocks in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It is to be understood that the present invention will be described in terms of a given illustrative architecture having a substrate; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. Similarly, it will also be understood that when an element described as a layer, region or substrate is referred to as being "beneath" or "below" another element, it can be directly beneath the other element or intervening elements may also be present. In contrast, when an element is referred to as being "directly beneath" or "directly below" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSH) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 1:
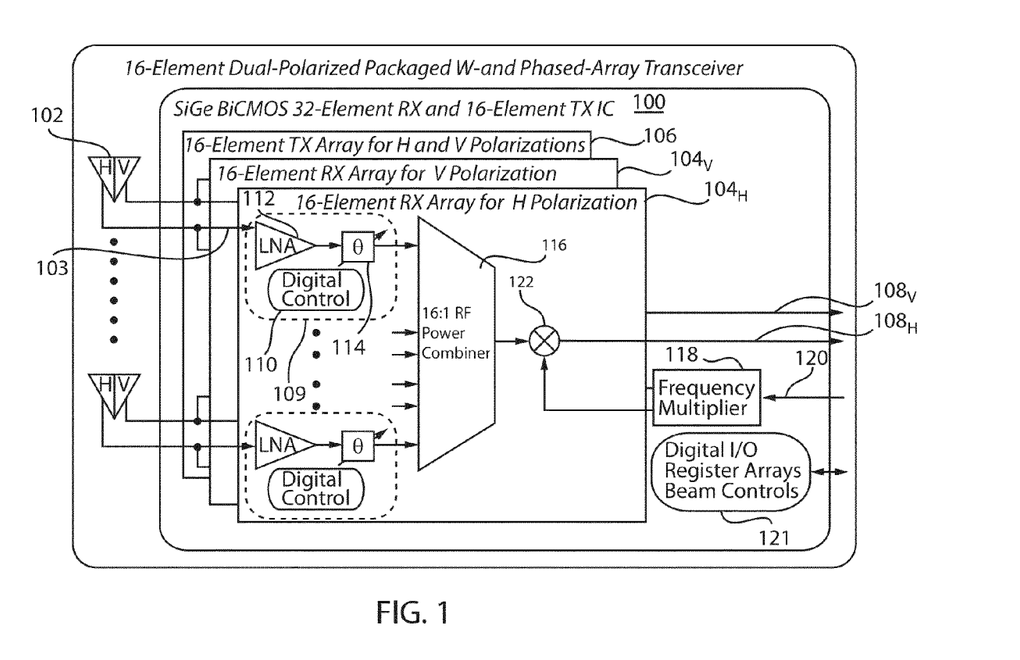
FIG. 1 is a high-level block/flow diagram illustrating a view of a transceiver device in accordance with an exemplary embodiment of the present principles.
Figure 2:
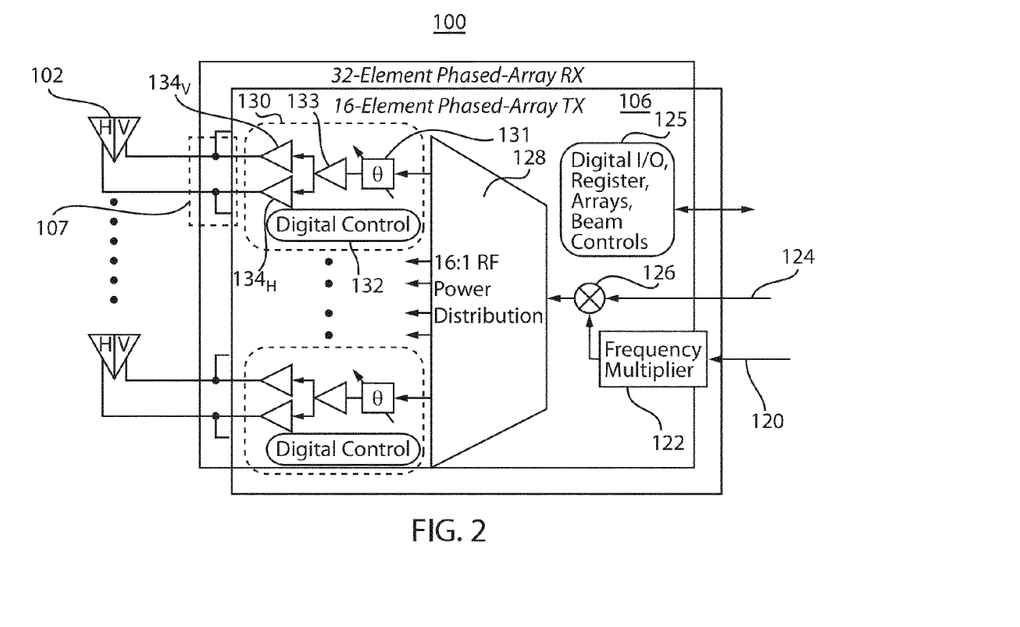
FIG. 2 is a high-level block/flow diagram illustrating another view of the transceiver device of FIG. 1.

Referring now to the drawings in which like numerals represent the same or similar elements and initially to FIGS. 1 and 2, a transceiver system, apparatus and device 100 in accordance with an exemplary embodiment is illustratively depicted. The system 100 can be implemented as a SiGe BiCMOS (Bipolar Junction-Complementary metal-oxide-semiconductor) W-band phased-array chipset with an in-package antenna array that is suitable for building larger scalable arrays at the board level by tiling packaged integrated circuits (ICs) adjacent to each other. The design can make use of antenna-in-package technology and the preferred embodiment includes at least a 4×4 array with at least a portion of the array formed with $\lambda/2$ element spacing at a 90-GHz center frequency and approximately ±6 GHz bandwidth. The antenna elements 102 in this embodiment have dual polarization and can be implemented using a 288-pin BGA package. Further, the receiver (Rx) portion, $104_V$ and $104_H$, of the transceiver integrated circuit (IC) 100 has 32 inputs 103, 16 for each of the two polarizations, and two outputs, $108_V$, if the intermediate frequency (IF) is vertical (V)-polarized, and $108_H$, if the IF is horizontal (H)-polarized, so that it is capable of simultaneously receiving both orthogonal polarizations. Thus, the Rx portion $104_V$ and $104_H$ of the IC 100 consists of 32 Radio Frequency (RF) front-ends 109, arranged in two groups of 16 elements, one for each antenna polarization. This architecture permits for simultaneous reception in both polarizations. The transmitter (Tx) portion 106 of the IC 100 will have 16 outputs 107 so that it is capable of transmitting in either polarization.

The Rx portion, $104_V$ and $104_H$, of the IC 100 is configured to perform RF-path phase-shifting and gain equalization, followed by RF power-combining and down-conversion to IF. The Rx portion, $104_V$ and $104_H$, includes a digital I/O module 121 for the control of register arrays and for beam control. For each input 103, a digital controller 110 can control a low noise amplifier (LNA) 112 and can control a phase shifter 114 to implement gain equalization and phase-shifting. Further, each 16-element sub-array $104_V$ and $104_H$ includes an independent power combiner 116 and down-conversion mixer 122. For example, a 16:1 RF power combiner in each of the Rx arrays $104_V$ and $104_H$ can implement the power-combining function. In addition, a common frequency multiplier 118 can provide an off-chip local oscillator (LO) reference signal 120 to both arrays $104_V$ and $104_H$ and can employ a mixer 122, in each of the Rx arrays $104_V$ and $104_H$, to implement down-conversion of the input signal to an IF. To maintain phase coherence among widely separated elements, the LO reference signal 120 is distributed at the board level, which would be multiplied to create an internal LO signal for the mixer 122. A separate combiner IC 150, illustrated in FIG. 6, combines IF signals from the Rx ICs outputs $108_V$ and $108_H$ and provides the board-level LO reference 120.

Analogously, the Tx portion 106 of the ICs 100 receives IF signals 124 from a distributor IC (not shown), up-converts the signals to RF, performs RF power-distribution, implements RF-path phase-shifting and amplitude control and performs power amplification. The Tx portion 106 of the IC 100 is shown in FIG. 2. Here, Tx portion 106 cane alternatively transmit on each polarization. Similar to the Rx portion, the Tx portion 106 includes a digital I/O module 125 for the control of register arrays and for beam control. The IC 106 includes a frequency multiplier 122 that receives the off-chip LO reference signal 120 and multiplies the signal. In turn, the up-conversion mixer 126 combines the multiplied signal with the IF signal 124, which can be polarized in either the horizontal or the vertical direction, to up-convert the signal to RF. A 1:16 power distribution network 128 receives the up-converted signal and distributes the signal to 16 RF front ends 130, each of which is controlled by respective digital control modules 132. The front ends 130 each include a phase shifter 131 that implements RF-path phase shifting and an amplifier 133 that implements amplitude control. In each of the 16 RF phase-shifting front-ends 130, two copies of the final power amplifiers (PA) stages $134_V$ and $134_H$ are included for power amplification in order to drive both polarization feed lines to the antennas 102. Through the digital control module 132, only one of the final PA stages $134_V$ and $134_H$ is active at any given time, depending on the desired polarization. This scheme avoids the use of an RF switch which would increase the IC area and reduce the effective output power. The phase-shifting RF front-ends in both the transmitter and receiver portions implement 5 to 7b digital control of phase and amplitude and include local memory arrays to facilitate beam steering operation and calibration in the overall array.

Figure 5:
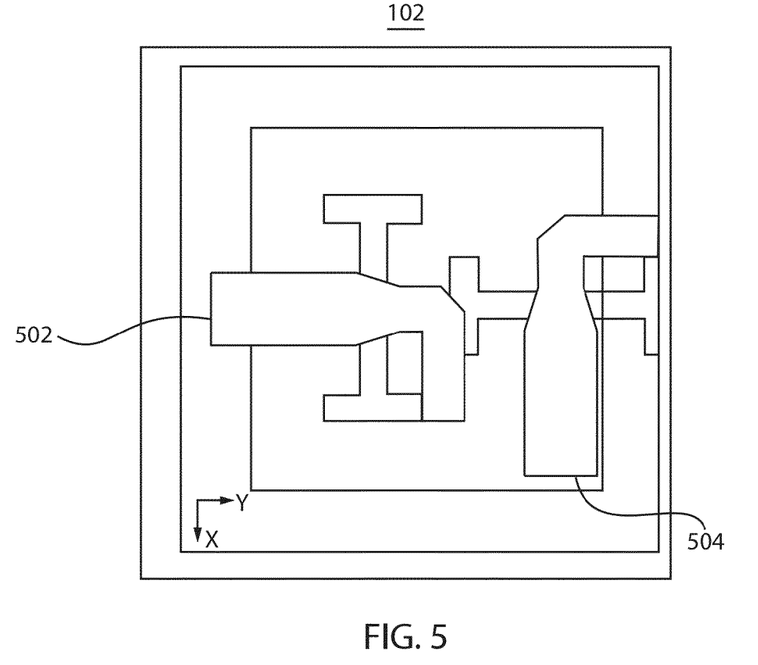
FIG. 5 is a high-level block diagram of an antenna in accordance with an exemplary embodiment.
Figure 18:
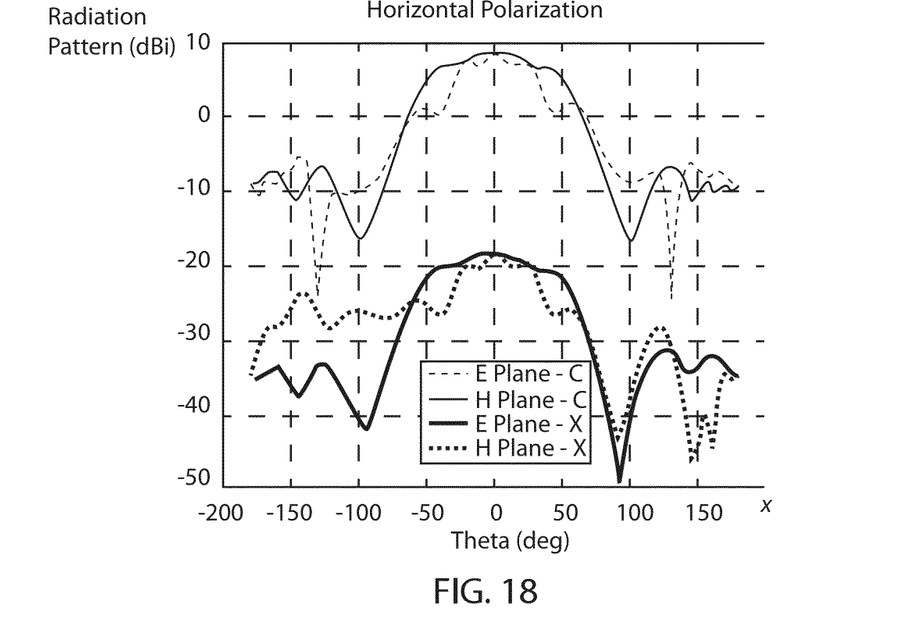
FIGS. 18 and 19 are diagrams of simulated co-polarization/cross-polarization radiation patterns on the E and H planes for horizontal and vertical ports, respectively, of an antenna element in accordance with an exemplary embodiment.
Figure 19:
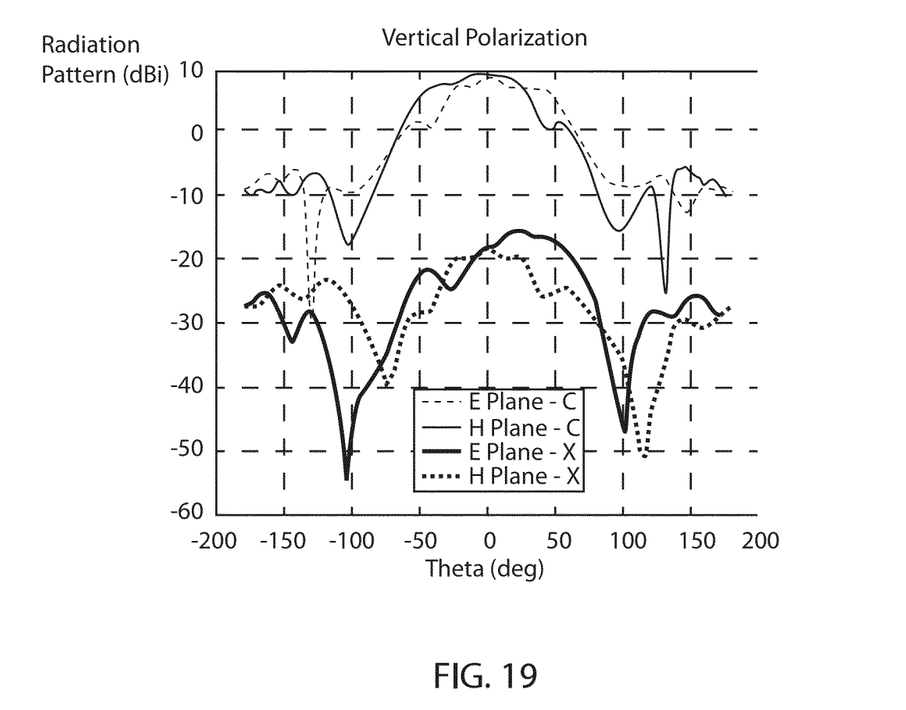

The antennas 102 are each a dual-polarized aperture-coupled stacked patch antenna. One possible structure of a dual-polarized antenna 102 is illustrated in FIG. 5, which includes a port 502 for horizontal polarization and a port 504 for vertical polarization. Preliminary simulations indicate that the antenna 102 has at least 15% return loss bandwidth and port isolation that is better than 25 dB. FIGS. 18 and 19 show the simulated co-polarization/cross-polarization radiation patterns on the E and H planes for the horizontal and vertical ports, respectively. The antenna front to back ratio is greater than 17 dB.

In accordance with one exemplary aspect, as noted above, the proposed transceivers can be packaged in a way that minimizes side lobes of the array radiation patterns, thereby avoiding quality degradation of the communication signals. A package with antennas can be characterized as having a size equivalent to a grid or matrix of M×M points. The spacing between the points in the grid is approximately λ/2, where λ is the wavelength of interest for the antenna array, as indicated above. The package houses a set of ICs that together feed or are coupled to a set of N×N antennae where N<M. Out of the M×M possible antenna locations in the package, only N×N locations are occupied. Moreover, the packages are to be tiled in both x and y dimensions, forming a large-scale array. Exemplary embodiments can choose the antenna locations in the individual packages to minimize the sidelobes of the radiation pattern from the array while accounting for practical limitations of routing between the ICs and the package at mm-Wave frequencies.

Figure 3:
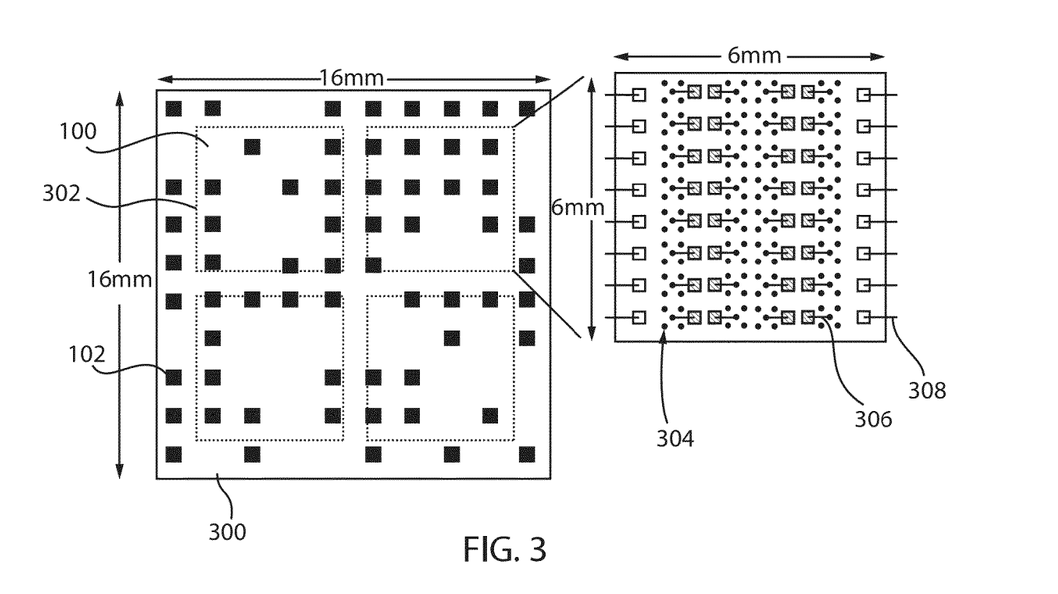
FIG. 3 is a high-level block diagram illustrating top view of circuit package in accordance with an exemplary aspect of the present principles.
Figure 6:
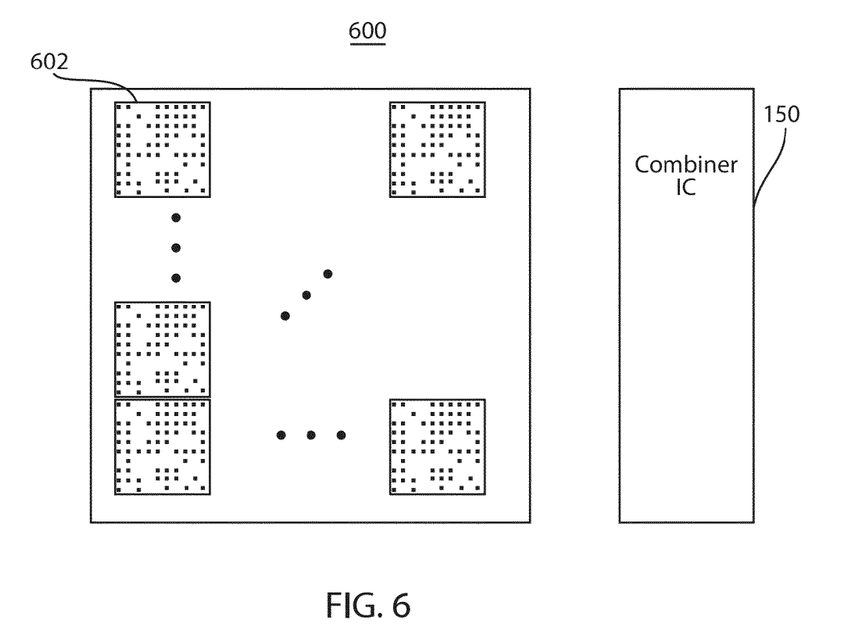
FIG. 6 is a high-level block diagram of a scaled antenna array comprised of circuit packages in accordance with an exemplary embodiment.

If we consider the spacing between antennas in the x and y directions each to be a continuous variable, a random population of the antennas in the available space attempts to sample the entire range of the variables uniformly. This arrangement is illustrated in FIG. 3 and FIG. 6. and it leads to reduced sidelobes. For example, FIG. 3 illustrates a top view of one possible transceiver package 300. The arrangement of antenna elements 102 in FIG. 3 is merely an example; other arrangements of antenna elements 102 can be implemented in the package 300. The transceiver package 300 connects the phased-array ICs 100, which are beneath the areas of the package denoted by lines 302 in FIG. 3, to antennas 102 using flip-chip technology. The W-band input and outputs are routed to the antennas through vias 304 and 50-Ω interconnects 306 on the package 300, while the direct current (DC) and analog connections 308 are routed to a ball-grid array. Multiple packages 300 can be attached to a printed circuit board, thereby enabling a tiled large-element array 600, as illustrated in FIG. 6, where each of the elements 602 can be implemented as package 300.

Figure 4:
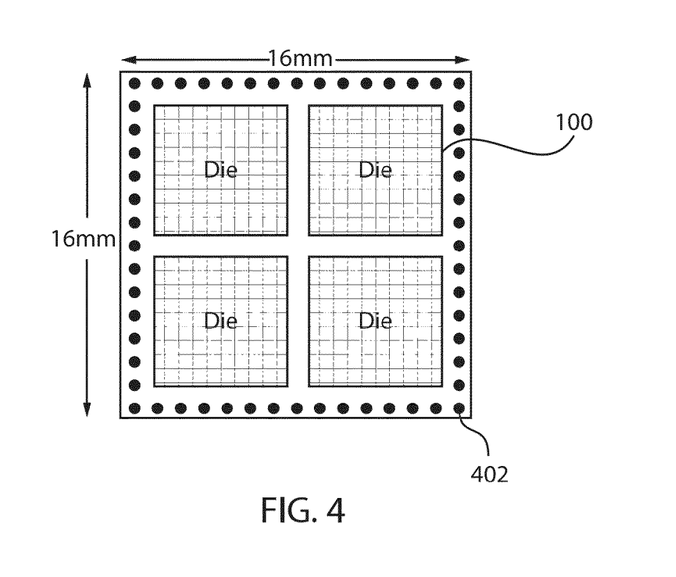
FIG. 4 is a high-level block diagram illustrating bottom view of the circuit package of FIG. 3.

As illustrated in FIG. 3, one embodiment of the present principles is directed to a four-chip 100 package that incorporates 64 antennas 102, 16 for each IC 100, in a fractal pattern. FIG. 4 provides a bottom view of the package 300, where elements 402 denote the portions of the BGA employed from DC and baseband connections. Sharing the DC and digital interconnects 308 and 306 among the four ICs 100 enables all four IC 100 to fit in a 16×16 mm² package, resulting in an array fill factor of 64%. This fill factor will be maintained for arbitrarily large arrays if the packages were combined, as illustrated in FIG. 6. FIG. 6 depicts a method of tiling multiple packages 602 (sub-arrays), which can be implemented with packages 300, in a way that provides a contiguous ground plane across different packages. Each of these packages 602 with, for example, 64 antennas, can be tiled on a two-dimensional grid.

Figure 7:
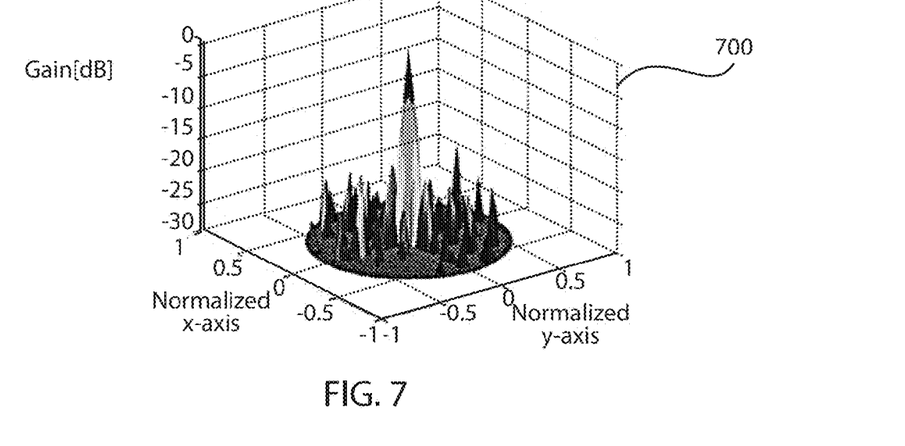
FIG. 7 is a diagram of a simulated radiation pattern of a scaled integrated circuit comprising circuit packages that utilize a random arrangement of antennas in accordance with an exemplary embodiment.
Figure 8:
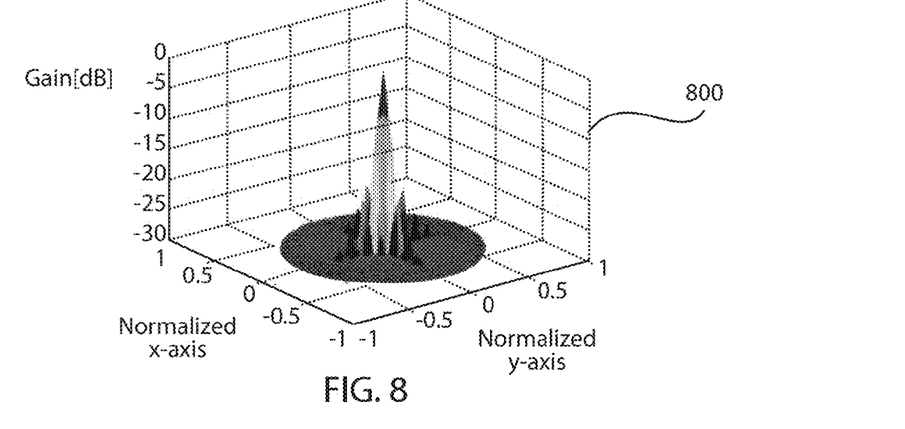
FIG. 8 is a diagram of a simulated radiation pattern of a scaled integrated circuit comprising circuit packages that utilize a uniform-pattern arrangement of antennas with a 100% fill factor.
Figure 9:
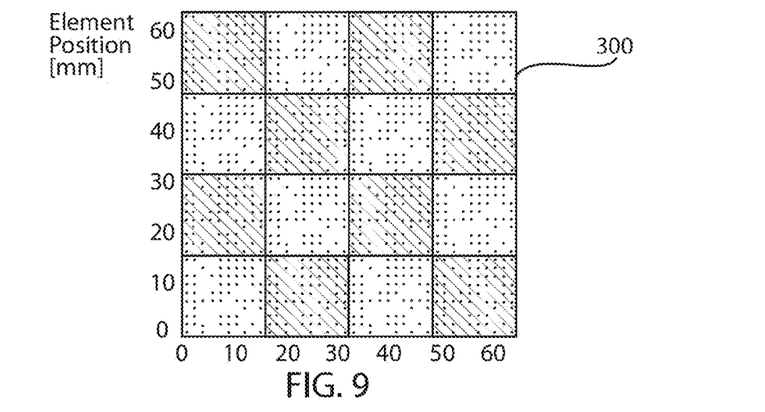
FIG. 9 is a high-level block diagram of the scaled integrated circuit for which the radiation pattern of FIG. 7 was simulated.

As indicated above, the irregular, non-uniform random pattern of the antenna elements 102 in FIG. 3 provides substantial benefits in ensuring that the sidelobes of the array radiation patterns are minimized. To gauge the impact of the non-uniform array, simulations were run to compare the array radiation patterns of the array to those of a completely filled uniform array. FIG. 7 shows a simulated array pattern 700 for 4×4 tiles of a 10×10 array on 16×16 mm² packages (1600 antennas in total) that employ the fractal pattern of antennas of FIG. 3. In turn, FIG. 8 shows a simulated array pattern 800 for 4×4 tiles of a 64 element array on 16×16 mm² packages (1024 antennas in total). FIG. 9 illustrates the 16×16 mm² packages that employ the fractal pattern of antennas of FIG. 3. Both patterns 700 and 800 have an antenna beam width of 1.2°. As illustrated in FIGS. 7 and 8, the non-uniform array results in additional sidelobes that are not present in the uniform array. However, the peak sidelobe levels in the 64 element array are −20 dB compared to the −21 dB for the 100 element array, and the additional sidelobes are in the range of −25 dB or less. It should be noted that no amplitude tapering or digital corrections are applied to the arrays, both of which can be used to significantly improve the sidelobe performance. Real planar arrays tend to show sidelobe levels in the −10 to −15 dB range without sidelobe level suppression. Coupling between antennas is a large factor in this behavior. This makes the simulated sidelobe level difference between the non-uniform and uniform arrays less significant in practice.

Although the arrangements of FIGS. 3, 6 and 9 provide benefits in terms of reducing side lobes of array radiation patterns, such arrangements may be relatively difficult to implement in the context of designing mm-Wave packages that house multiple ICs. For example, in this case, the routing from the ICs to each antenna would have to be customized. In addition, routing to particular locations may not be possible or may result in excessive losses, coupling or phase shift.

Figure 10:
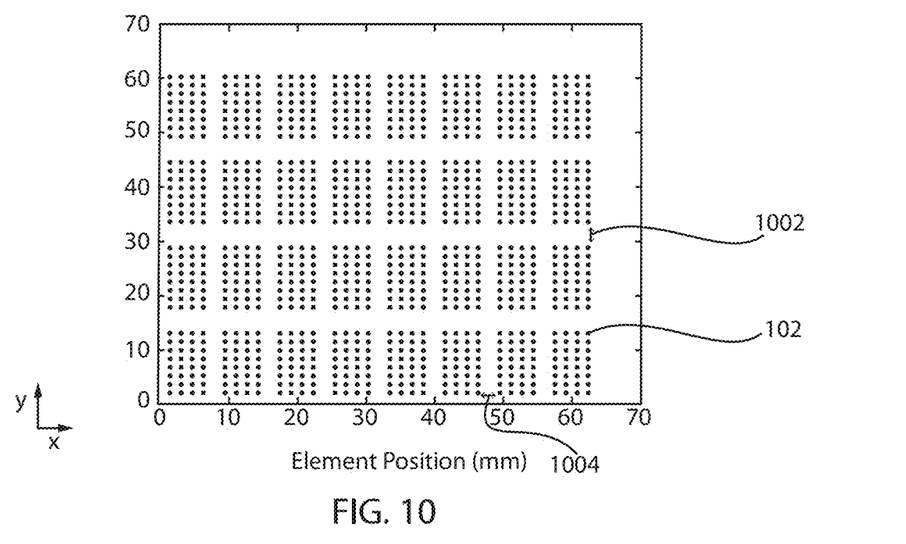
FIG. 10 is a high-level block diagram of a scaled antenna array comprising integrated circuit packages that utilize a uniform-pattern arrangement of antennas.
Figure 11:
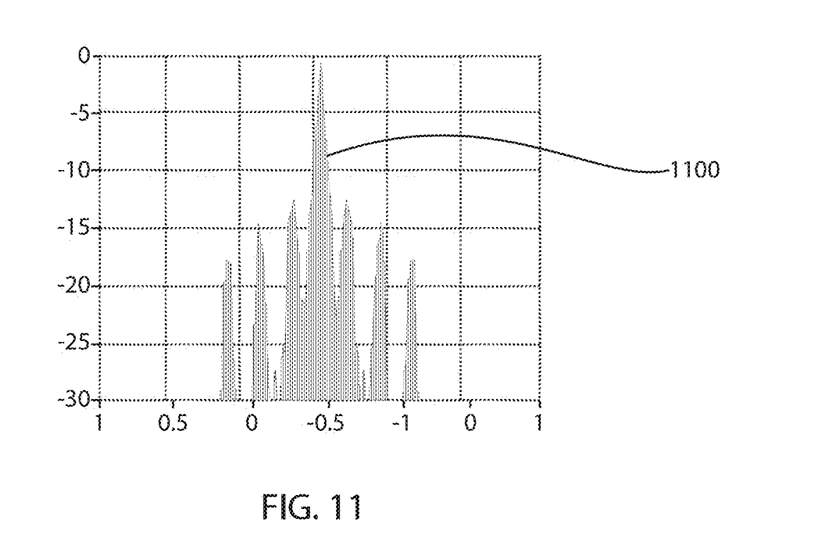
FIG. 11 is a diagram of a simulated radiation pattern of the scaled integrated circuit of FIG. 10.

One straightforward way of addressing IC routing issues is placing the N×N antennas together or in identical sub-groups. This approach is the easiest from a package design stand point. An arrangement 1000 of antenna 102 resulting from placing the N×N antennas together or in identical sub-groups is shown in FIG. 10. However, this simple antenna placement strategy leads to systematic spacing 1002, 1004 between antenna elements 102. This deterministic placement might result in some values for the x and y array dimension variables being sampled many times while some values are not sampled at all. In other words, such a placement strategy produces systematic or periodic regions without antennas. Such regions in the arrangement result in large and systematic side lobes, as shown in FIG. 11, illustrating the array radiation pattern 1100 for the arrangement 1000.

Figure 12:
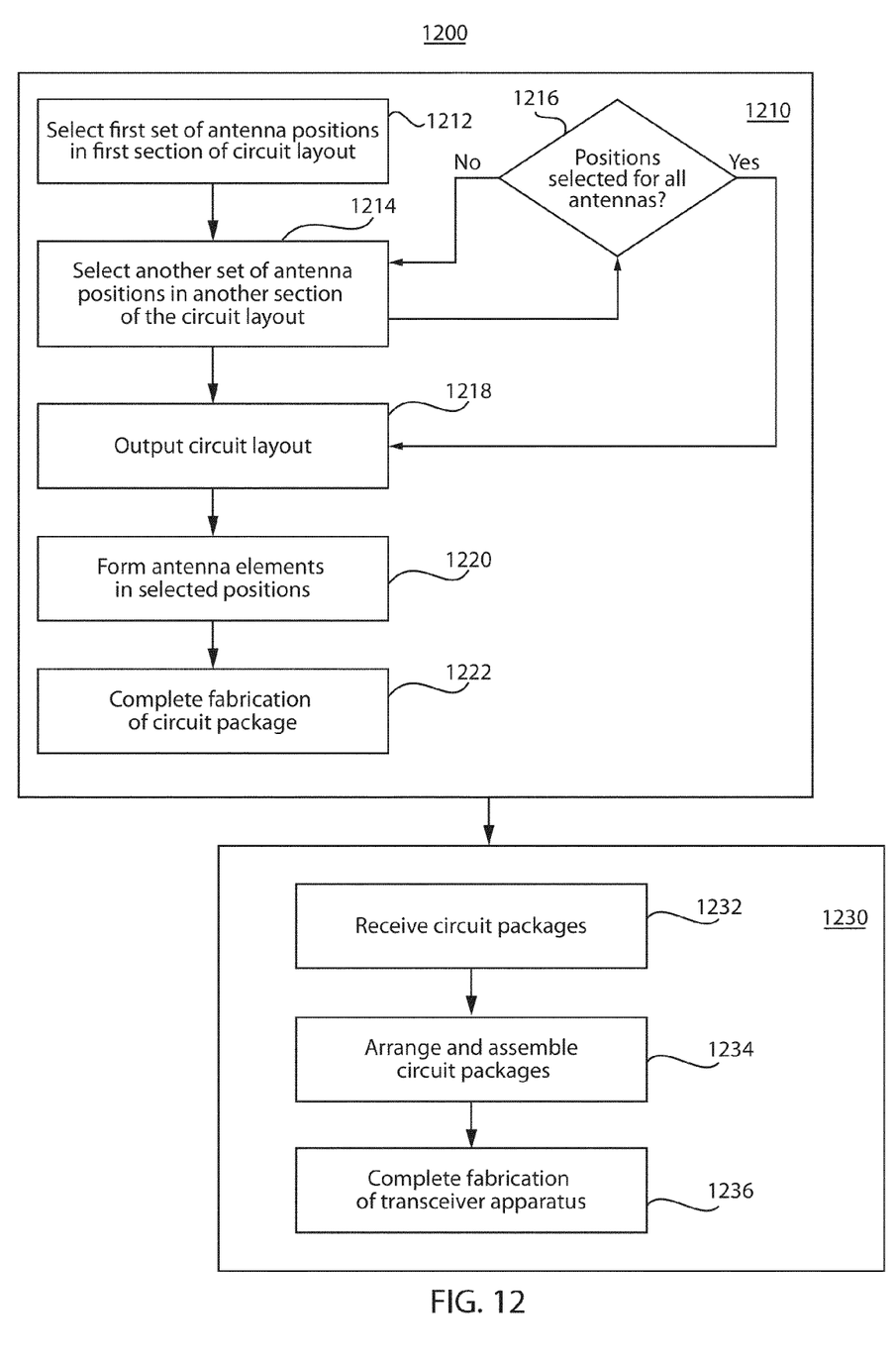
FIG. 12 is a high-level block/flow diagram of an exemplary method for fabricating a transceiver apparatus in accordance with an exemplary embodiment.

Aspects of the present principles described herein can provide packages that substantially reduce side lobes of the array radiation patterns and facilitate routing between the ICs and the antennas during production. FIG. 12 illustratively depicts a method 1210 for designing and fabricating a circuit package in accordance with an exemplary embodiment. The method 1210 can be incorporated into a method 1200 for fabricating a transceiver apparatus by combining it with an assembly method 1230. However, it should be understood that the methods 1210 and 1230 can be performed independently. In addition, at least a portion of the method 1200 can be performed by a processor of a computer system, such as the processor 1710 of the system 1700 of FIG. 17. Here, the computation module 1712 implemented by the processor 1710 can apply one or more portions of the method 1210 and/or the method 1230 to a circuit layout stored in the storage medium 1704. The circuit layout can, for example, model the M×M possible antenna locations of the package 300. In addition, the computation module 1712 can implement a program of instructions comprising steps of the method 1210 and/or the method 1230.

The method 1210, and also 1200, can begin at step 1212, at which the computation module 1712 can select a first set of antenna positions in a first section of a set or plurality of sections of the circuit layout for the circuit package. The selection can be made such that consecutive unselected positions in the section does not exceed a pre-determined number K. For example, the set or plurality of sections can represent the stacked rows of the M×M matrix of possible antenna locations of the package 300. In addition, the computation module 1712 can be configured to select N antenna positions from the possible or selectable antenna positions in a row of the M×M matrix, where N×N is the total number of antenna that is to be formed in the package. Here, the row can have up to $$K = \frac{M^2 - N^2}{M} + 1$$

empty positions. It should be noted that the "first row" described here need not be the first row of the M×M matrix.

At step 1214, the computation module 1712 select another set of antenna positions in another section of the circuit layout such that an arrangement of selected antenna positions of the other set is different from an arrangement of selected antenna positions of a previously selected set of antenna positions. For example, the selection of the arrangement of antenna positions for the other section can be made such that at least one position in the arrangement is different from the arrangement of a previously selected set of antenna positions. Here, the other section can, for example, be any other row of the M×M matrix, including a row that is above the first section or a row that is below the first section. In addition, the other row can be an adjacent row. Further, the computation module 1712 can be configured to select N antenna positions from the other section.

The method 1210 can then proceed to step 1216, at which the computation module 1712 can determine whether selections have been made for a total number of antenna positions. In the example described above, the computation module 1712 can determine whether the antenna position selections for all N×N antenna to be included in the package have been made. If not, then the method can proceed to step 1214 and can be repeated. If selections have been made for the total number of antenna positions, then the method can proceed to step 1218, at which the computation module 1712 can output the circuit layout that includes the selected antenna positions.

As noted above, the computation module 1712 can be configured to make the selections in steps 1212 and 1214 such that consecutive unselected positions in a section do not exceed a predetermined number (K) of positions. For example, the computation module 1712 can perform the iterations of the step 1214 by making changes in the antenna locations from one row to the next in such a way as to avoid more than $$K = \frac{M^2 - N^2}{M} + 1$$

consecutive spaces (empty or unused locations) in either the x or y directions. Thus, computation module 1712 can perform the steps 1214 and 1214 such that consecutive unselected positions do not exceed the $$\frac{M^2 - N^2}{M} + 1$$

positions in any row or column of the matrix. Indeed, the computation module 1712 can perform the steps 1214 and 1214 such that consecutive unselected positions do not exceed the predetermined number of K positions in any portion of the circuit layout. In accordance with one exemplary aspect, the computation module 1712 can perform the selections of steps 1212 and 1214 for rows of the M×M matrix in order in a vertical direction, where one or more rows can be skipped in the performance of any of steps 1212 and 1214. In addition, the computation module 1712 can preferably perform the selections such that the "previously selected set of antenna positions" described above with respect to step 1214 is the set of antenna positions selected in an immediately preceding selection step. Thus, the difference in the arrangement of selected antenna positions is made with respect to the arrangement of the set of antenna positions selected in the immediately preceding selection step. Furthermore, the computation module 1712 preferably selects the arrangement of selected antenna positions such that the selected arrangement is unique with respect to as many previously selected arrangements as possible. Moreover, the computation module 1712 preferably selects the arrangement of antenna positions such that the selected arrangement of selected antenna positions in an iteration of step 1214 is differed as little as possible from the arrangement of antenna positions selected in an immediately preceding selection step. Thus, in a preferred embodiment, the computation module 1712 is configured to change only one antenna location with respect to a set of antenna locations selected in an immediately preceding selection step such that the arrangement is unique with regard to the set of antenna locations selected in an immediately preceding selection step, if possible to meet the constraint that consecutive unselected positions are not exceeded in a section of the circuit layout, in the x and y directions of the circuit layout (i.e., if the matrix implementation is employed, in any row or column) and/or any portion of the circuit layout, depending on the constraint regarding consecutive unselected positions utilized.

From a package design perspective, a smaller number of changes between antenna locations in each row leads to a more systematic and predictable routing between ICs and antennas, which thereby increases package and antenna performance reliability. On the other hand, having large systematic spaces between antennas leads to large side-lobes. So for a given, N, M and number of ICs in a package, an optimum solution exists and can be determined and applied in the method 1210. As such, the number of predetermined positions need not be the same for each performance of steps 1212 and/or 1214. For example, to apply the optimum solution, which depends on the values of N, M and the number of ICs in the matrix example provided above, different sections of the circuit layout can be designated to have different corresponding predetermined numbers of consecutive unselected positions in variations of the embodiments described above.

Figure 13:
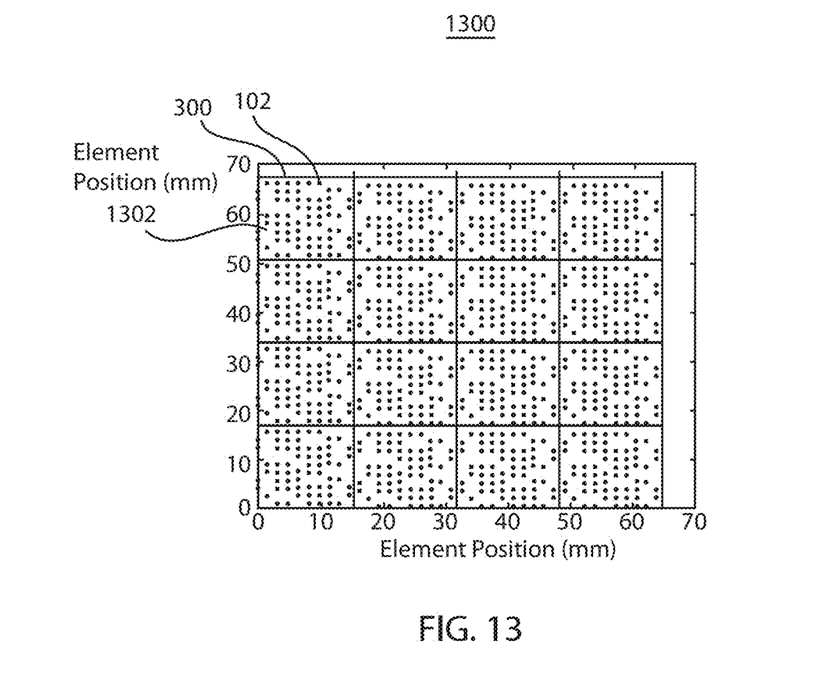
FIG. 13 is high-level diagram of a scaled antenna array comprising integrated circuit packages that utilize an alternative non-uniform arrangement of antennas in accordance with an exemplary embodiment.

At step 1220, antenna elements can be formed in the positions of the circuit layout selected at steps 1212 and 1214, as described above. For example, the antenna elements can be formed in the positions of the circuit layout to form a package 300, where an arrangement of antennas selected in accordance with the method 1200 can be formed to generate the package 300. A particular example of the arrangement is illustrated in FIG. 13, which is described in more detail herein below. It should be noted that unselected positions can correspond to positions that are empty or positions that are filled with dummy antenna, where the formation step 1220 can comprise activating or coupling the IC circuitry 100 to only selected antenna elements. In addition, it should be further noted that the computation module 1712 can direct a physical, automated formation of the antenna elements 102 onto a circuit layout.

At step 1222, the fabrication of the circuit package can be completed. For example, the antenna elements 102 can be coupled to integrated circuits 100 to form the package 300, as described above. In addition, the computation module 1712 can direct a physical, automated fabrication of the package 300 at step 1222.

Thereafter, the method 1200 can proceed to the package assembly method 1230. The method 1230 can assemble multiple packages 300 generated in accordance with the method 1210 and the method 1230 can be performed by a production entity that is different from a production entity that implements the method 1210. As noted above, the methods 1210 and 1230 can be performed independently. It should be further noted that the steps 1212-1218 can also form an independent method for embodiments directed to designing a circuit layout.

The method 1230 can begin at step 1232, at which circuit packages fabricated in accordance with the method 1210 can be received.

Figure 14:
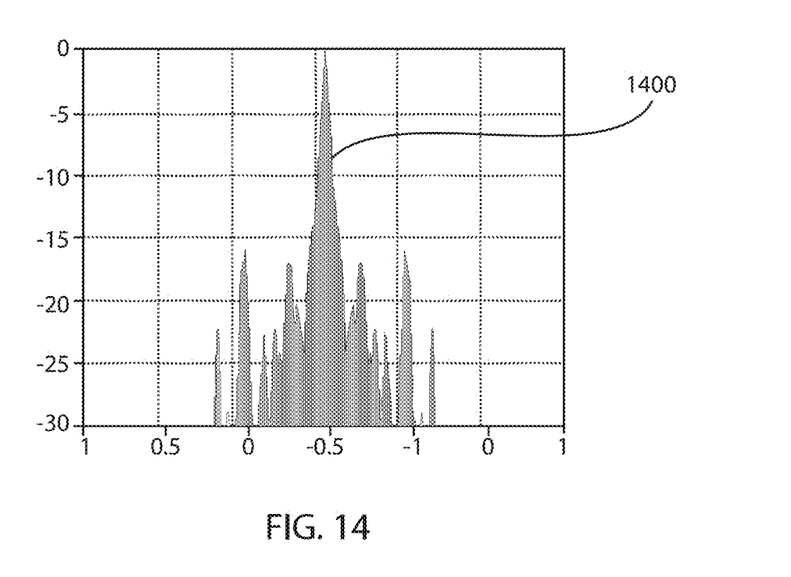
FIG. 14 is a diagram of a simulated radiation pattern of the scaled integrated circuit of FIG. 13.

At step 1234, the received circuit packages can be arranged and assembled. Here, in accordance with one exemplary aspect, the computation module 1712 can direct the implementation of step 1234. An exemplary arrangement 1300 of packages 300 that can be implemented in accordance with step 1234 is illustrated in FIG. 13. Here, each of the packages 300 can include an arrangement 1302 of antenna elements 102, which can be formed in accordance with step 1220. In the particular example of provided in FIG. 13, sixteen packages 300 (4×4 packages) are assembled to form the scaled IC 1300. The corresponding simulated array radiation pattern 1400 for IC 1300 is shown in FIG. 14. This array pattern has very similar side lobe levels as those attained by the ideal solution in FIG. 3.

Figure 16:
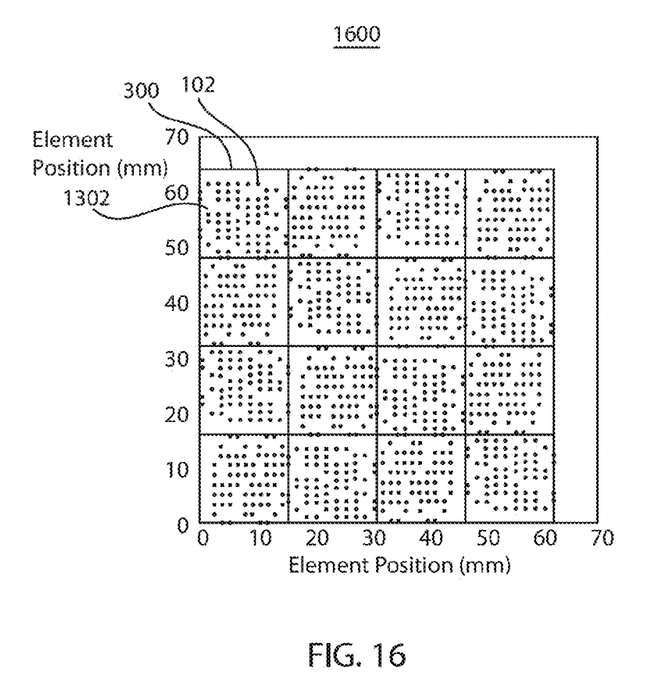
FIG. 16 is high-level diagram of a scaled antenna array comprising integrated circuit packages that utilize an alternative non-uniform arrangement of antennas in accordance with an exemplary embodiment.

It should be noted that, in this example, when the packages 300 are tiled together, spaces of more than $$\frac{M^2 - N^2}{M} + 1 = 4$$

antenna locations appear between one package and the other. As noted above, large systematic spaces between antennas leads to large side-lobes. To avoid having these voids in a periodic fashion, at step 1234, the packages 300 can be arranged and assembled such that each given package of the received circuit packages is oriented differently from any packages that are adjacent to the given package. In other words, the packages 300 are tiled with a non-uniform orientation. For example, adjacent packages can be rotated by 90 degrees with respect to one another. An example of this arrangement 1600 is illustrated in FIG. 16, where each given package 300 is rotated by 90 degrees with respect to any packages that are adjacent to the given package.

At step 1236, the fabrication of the transceiver apparatus can be completed.

Figure 15:
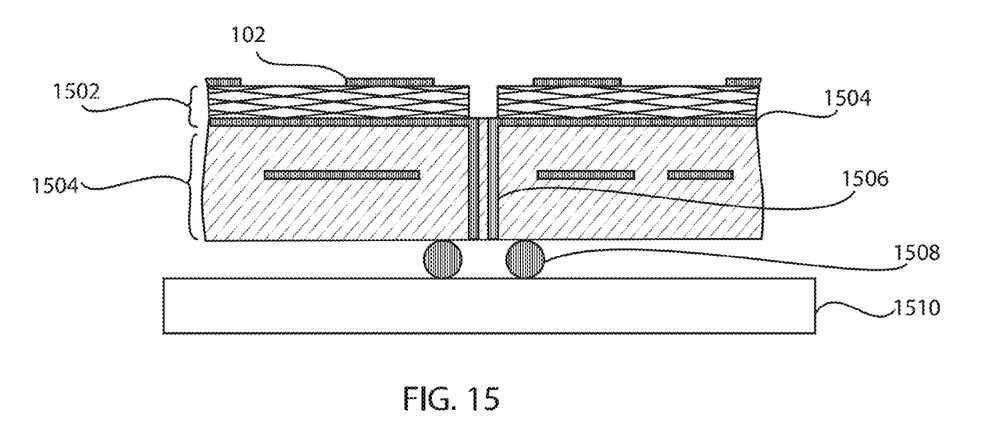
FIG. 15 is a cross-sectional view of a circuit package in accordance with an exemplary embodiment.

With regard to fabrication details of methods 1210 and 1230, it should be noted that the packages 300 can be fabricated by multiple sub-laminations, as illustrated in FIG. 15. For example, the package 300 can include a sub-laminate 1502 on which antenna elements 102 can be formed in the fractal pattern illustrated in FIG. 3 or in the non-uniform pattern 1302 of FIG. 13. The package can also include a sub-laminate 1504. Edge plating can be performed for some of the sub-laminates. Additionally, edge-plating can be used to form edges 1506 that are connected to the antenna ground 1504. Further, plated edges can be directly soldered to each other to form a eutectic solder 1507 during or after BGA 1508 assembly on a board 1510.

The embodiments described herein above enable the fabrication of circuit packages that have negligible interference-inducing side lobes of antenna array radiation patterns. Furthermore, the arrangements of antenna elements described herein also permit simplified routing of connections between antenna elements and underlying integrated circuitry.

Having described preferred embodiments of a systems, methods, apparatuses and devices directed to phased-array transceivers (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method, comprising:
fabricating a circuit package,
wherein said fabricating step includes:
selecting a first set of antenna positions in a first section of a set of sections of a circuit layout for the circuit package;
selecting an other set of antenna positions in an other section of the circuit layout such that an arrangement of selected antenna positions of the other set is different from an arrangement of selected antenna positions of a previously selected set of antenna positions;
iterating the selecting an other set of positions in an other section until selections have been made for a total number of antennas, wherein said selecting the other set is performed such that consecutive unselected positions in the other section do not exceed a predetermined number of positions; and
forming antenna elements at the selected positions to fabricate the circuit package.

2. The method of claim 1, wherein each of the selected set of antenna positions have the same number (N) of selected positions, wherein each section of the set of sections have the same number (M) of selectable positions and wherein the predetermined number of positions is $$\frac{M^2 - N^2}{M} + 1.$$

3. The method of claim 2, wherein the set of sections are stacked rows of sections that form a matrix of selectable antenna positions and wherein said selecting the other set is performed such that consecutive unselected positions do not exceed the predetermined number of positions in any row or column of the matrix.

4. The method of claim 1, wherein the previously selected set of antenna positions is a set of antenna positions selected in an immediately preceding selecting step.

5. The method of claim 1, wherein the predetermined number of positions is different for at least two of said selecting the other set of antenna position steps.

6. The method of claim 1, for at least one of the selecting an other set of antenna positions steps, the arrangement of selected antenna positions of the other set is different by one antenna position from the arrangement of selected antenna positions of the previously selected set of antenna positions.

7. A system, comprising:
a circuit package forming subsystem, wherein the circuit package forming subsystem includes:
a storage medium configured to store a circuit layout for the circuit package; and
a computation module configured to select a first set of antenna positions in a first section of a set of sections of the circuit layout, select an other set of antenna positions in an other section of the circuit layout such that an arrangement of selected antenna positions of the other set is different from an arrangement of selected antenna positions of a previously selected set of antenna positions, and iterate the selection of an other set of positions until selections have been made for a total number of antennas, wherein said selection of the other set is performed such that consecutive unselected positions in any portion of the circuit layout do not exceed a predetermined number of positions.

8. The system of claim 7, wherein each of the selected set of antenna positions have the same number (N) of selected positions, wherein each section of the set of sections have the same number (M) of selectable positions and wherein the predetermined number of positions is $$\frac{M^2 - N^2}{M} + 1.$$

9. The system of claim 8, wherein the computation module is further configured to direct a formation of antenna elements at the selected positions to fabricate the circuit package.

10. The system of claim 7, wherein the previously selected set of antenna positions is a set of antenna positions selected in an immediately preceding selection.

11. The system of claim 7, wherein the predetermined number of positions is different for at least two of said selections of the other set of antenna position.

12. The system of claim 7, wherein for at least one of the selections of an other set of antenna positions, the arrangement of selected antenna positions of the other set is different by one antenna position from an arrangement of selected antenna positions of the previously selected set of antenna positions.

13. A computer readable storage medium comprising a computer readable program, wherein the computer readable program when executed on a computer causes the computer to perform the steps of:
forming a circuit package,
wherein said forming step includes:
selecting a first set of a number (N) of antenna positions in a first section of a number (M) of sections of a circuit layout for the circuit package, wherein each of the sections of the circuit layout is composed of M selectable antenna positions;
selecting an other set of N antenna positions in an other section of the M sections of the circuit layout such that an arrangement of selected antenna positions of the other set is different from an arrangement of selected antenna positions of a previously selected set of antenna positions; and
iterating the selecting an other set of positions until selections have been made for a total number of antennas, wherein said selecting the other set is performed such that consecutive unselected positions in any portion of the circuit layout do not exceed $$\frac{M^2 - N^2}{M} + 1$$

positions.

14. The method of claim 1, wherein the first set of antenna positions and the other set of antenna positions in said selecting steps represent, during said selecting steps, candidate antenna positions for non-fabricated antenna elements, the non-fabricated antenna elements thereafter being fabricated in said forming step.

15. The method of claim 1, wherein the sets of sections of the circuit layout from which the computation module selects the first set and the other set of antenna positions comprise unfabricated circuit elements.

16. The computer readable storage medium of claim 13, wherein the first set of antenna positions and the other set of antenna positions in said selecting steps represent, during said selecting steps, candidate antenna positions for non-fabricated antenna elements, the non-fabricated antenna elements thereafter being fabricated in said forming step.

* * * * *